(12) United States Patent
Lin

(10) Patent No.: US 6,310,791 B1
(45) Date of Patent: Oct. 30, 2001

(54) POWER RECTIFIER

(76) Inventor: Chin-Feng Lin, 3F., No. 2, Lane 8, Fu Yuan Street, Hsintien, Taipei Hsien (TW)

( * ) Notice: Subject to any disclaimer, the term of this patent is extended or adjusted under 35 U.S.C. 154(b) by 0 days.

(21) Appl. No.: 09/753,555

(22) Filed: Jan. 4, 2001

(51) Int. Cl.[7] .............................. H02M 1/00; H02K 11/00
(52) U.S. Cl. ........................................ 363/141; 310/68 D
(58) Field of Search ..................................... 363/141, 144, 363/145, 146; 310/68 R, 68 D

(56) References Cited

U.S. PATENT DOCUMENTS

| | | | |
|---|---|---|---|
| 3,739,209 | * | 6/1973 | Drabik ..................................... 310/64 |
| 3,895,247 | * | 7/1975 | Iwata et al. ........................ 310/68 D |
| 4,941,069 | * | 7/1990 | Danenberg et al. .................. 361/419 |
| 5,742,498 | * | 4/1998 | Taniguchi et al. .................... 363/145 |

* cited by examiner

Primary Examiner—Matthew Nguyen
(74) Attorney, Agent, or Firm—Dougherty & Troxell

(57) ABSTRACT

A power rectifier includes a heat dissipation base, a hollow hexagonal gasket soldered to the heat dissipation base around a flat, circular projection of the heat dissipation base, a conducting rod member, a chip unit soldered between the conducting rod member and the flat, circular projection of the heat dissipation base, a resin molded on the chip unit and the heat dissipation base, and a cover shell soldered to the hexagonal gasket and covered over the chip unit and the conducting rod member, the hexagonal gasket having an upright contact flange press-fitted into the bottom open side of the cover shell to protect the chip unit against radiation of fusion upon the process of soldering the cover shell to the hexagonal gasket.

1 Claim, 3 Drawing Sheets

POWER RECTIFIER

BACKGROUND OF THE INVENTION

The present invention relates to a power rectifier, and more particularly to such a power rectifier, which has means to protect the chip unit against the radiation of fusion and to stop the resin from an overflow during its fabrication.

FIG. 1 shows a power rectifier according to the prior art. This structure of power rectifier comprises a heat dissipation base 1' adapted for fastening to a heat sink, a hexagonal gasket 2' soldered to the top side of the heat dissipation base 1' around a flat, circular top projection of the heat dissipation base 1', a chip unit 3', the chip unit 3' comprising a chip 31' and two molybdenum pads 32' respectively disposed at top and bottom sides of the chip 31', a conducting rod member 4' soldered to the top-sided molybdenum pad of the chip unit 3', the conducting rod member 4' having a shank 42', and a cover shell 5' soldered to the hexagonal gasket 2' and covered over the chip unit 3' and the conducting rod member 4' after the molding of a resin on the top of the heat dissipation base 1' and the chip unit 3'. The cover shell 5' comprises a center tube 51', which receives the shank 42' of the conducting rod member 4'. The top end of the shank 42' is extended out of the center tube 51' of the cover shell 5' and processed to form an end contact. After the hexagonal gasket 2' and the heat dissipation base 1' have been soldered together, the topmost edge of the heat dissipation base 1' is disposed in flush with the top side wall of the hexagonal gasket 2'. It is difficult to hold the chip unit 3' on the smooth topmost edge of the heat dissipation base 1' when soldering the chip unit 3' to the heat dissipation base 1'. When molding the resin on the heat dissipation base 1' and the chip unit 3', the molten resin may flow out of the heat dissipation base 1' over the hexagonal gasket 2', affecting further procedure of soldering the cover shell 5' to the hexagonal gasket 2'. Before soldering the cover shell 5' to the hexagonal gasket 2', the overflow of the resin must be removed. Further, when soldering the cover shell 5' to the hexagonal gasket 2' the radiation of fusion may damages the chip 31' of the chip unit 3'.

SUMMARY OF THE INVENTION

The present invention provides a power rectifier, which eliminates the aforesaid drawbacks. According to one aspect of the present invention, the hexagonal gasket has an upright contact flange disposed around the center through hole thereof and adapted to hold the chip unit in place when soldering the chip unit to the heat dissipation base. According to another aspect of the present invention, the upright contact flange prevents an overflow of the resin when molding the resin on the top of the heat dissipation base and the chip unit. According to still another aspect of the present invention, the upright contact flange is press-fitted into the bottom open side of the cover shell to protect the chip unit against the radiation of fusion when soldering the cover shell to the hexagonal gasket.

DETAILED DESCRIPTION OF THE PREFERRED EMBODIMENT

Figure 1:
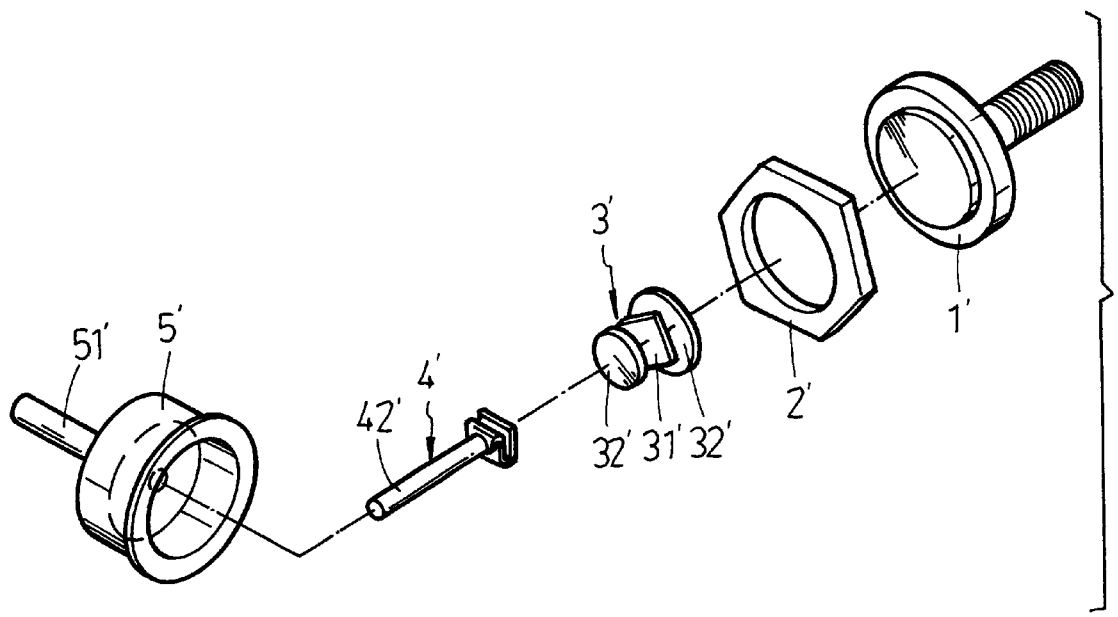
FIG. 1 is an exploded of a power rectifier according to the prior art.
Figure 2:
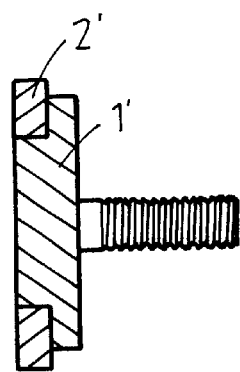
FIG. 2 is a sectional view showing the hexagonal gasket soldered to the heat dissipation base according to the prior art.
Figure 3:
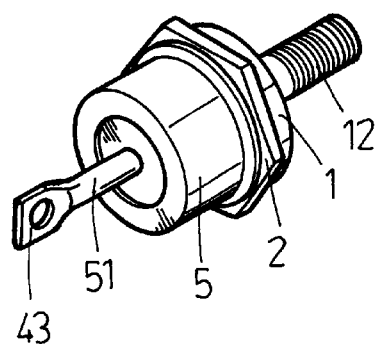
FIG. 3 is an elevational view of a power rectifier according to the present invention.
Figure 4:
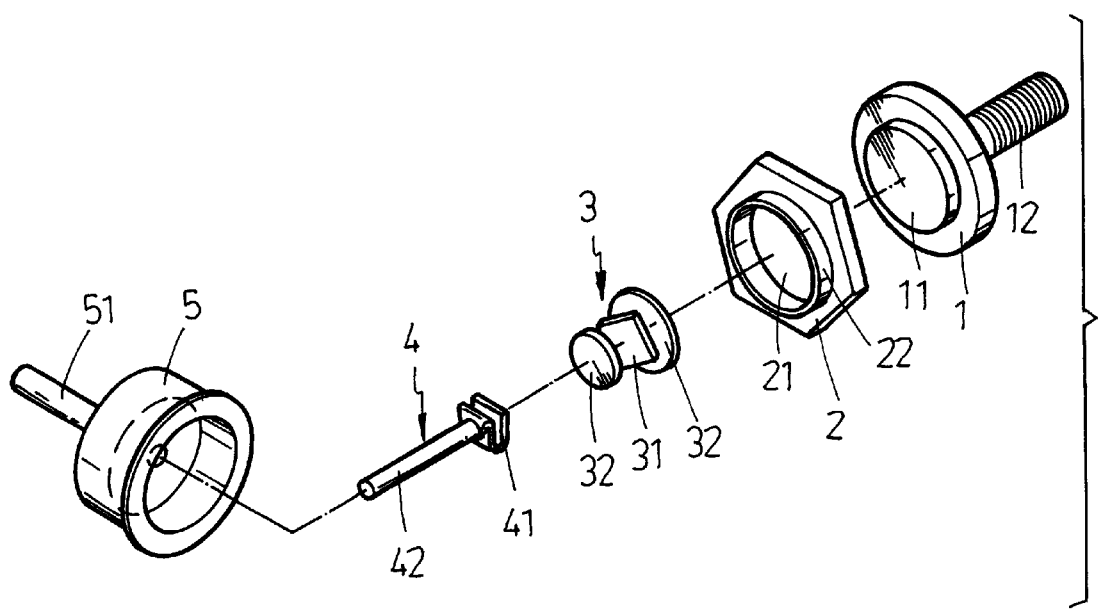
FIG. 4 is an exploded view of the power rectifier according to the present invention.
Figure 5:
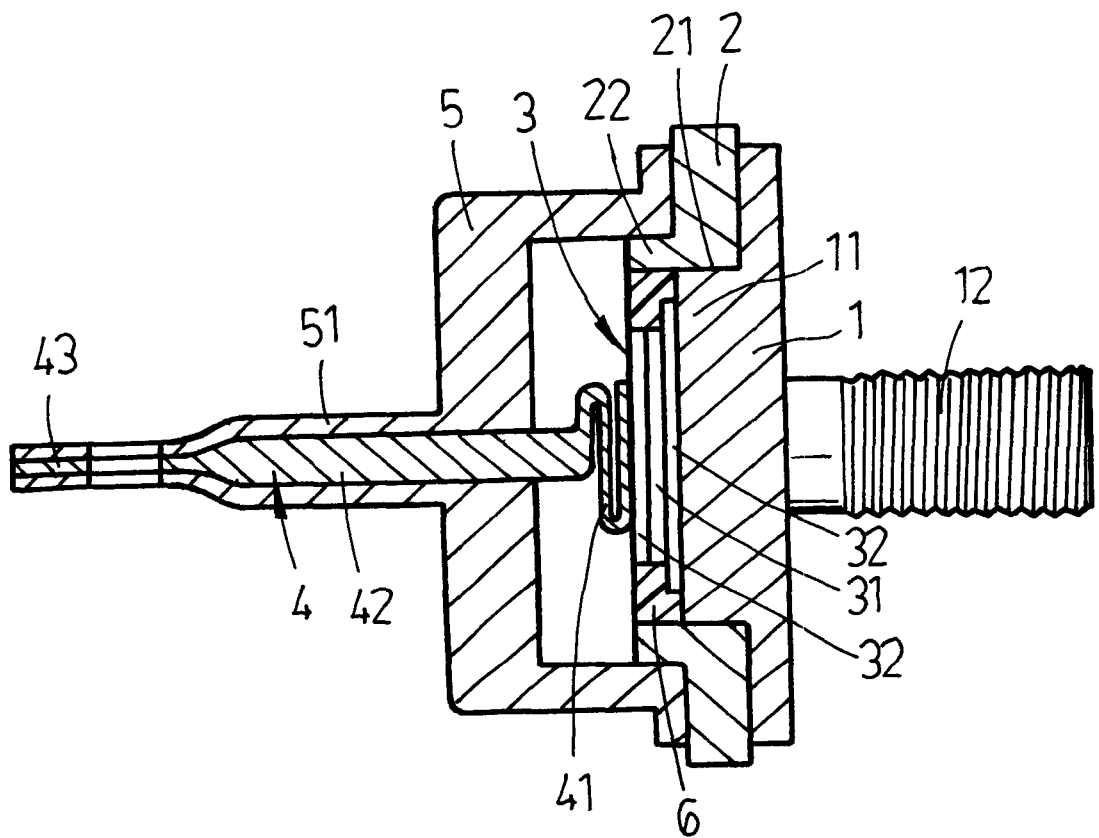
FIG. 5 is a sectional view in an enlarged scale of the power rectifier shown in FIG. 3.

Referring to FIGS. from 3 through 5, a power rectifier in accordance with the present invention is shown comprised of a heat dissipation base 1, a hexagonal gasket 2, a chip unit 3, a conducting rod member 4, and cover shell 5. The hexagonal gasket 2 is soldered to the top of the heat dissipation base 1. The chip unit 3 is mounted in the hexagonal gasket 2 and soldered to the heat dissipation base 1. The chip unit 3 comprises a chip 31, and two molybdenum pads 32 respectively soldered to the top and bottom sides of the chip 31. After soldering of the bottom-sided molybdenum pad 32 of the chip 31 to the heat dissipation base 1, an electrically insulative resin 6 is molded on the chip unit 3 in the gasket 2, keeping the top-sided molybdenum pad 32 of the chip 31 exposed to the outside for the connection of the conducting rod member 4. The conducting rod member 4 comprises a shank 42 inserted through the cover shell 5, and a soldering pad 41 provided at one end, namely, the bottom end of the shank 42 and soldered to the top-sided molybdenum pad 32 of the chip 31. The cover shell 5 is soldered to the hexagonal gasket 2 and covered over the chip unit 3 and the conducting rod member 4, having a center tube 51, which receives the shank 42 of the conducting rod member 4. After installation of the cover shell 5 in the hexagonal gasket 2, the top end of the shank 42 extends out of the center tube 51 of the cover shell 5, and is processed into a flat, eyelet end contact 43 (see FIG. 3).

Referring to FIGS. from 3 through 5 again, the heat dissipation base 1 comprises a flat, circular top projection 11 disposed at the top side thereof, and a screw rod 12 disposed at the bottom side thereof and adapted for fastening to a heat sink (not shown) for enabling heat to be quickly transmitted from the power rectifier to the heat sink. The hexagonal gasket 2 comprises a circular center through hole 21, which receives the flat, circular top projection 11 of the heat dissipation base 1, and an upright contact flange 22 disposed at the top side thereof around the circular center through hole 21 and press-fitted into the bottom open side of the cover shell 5 and kept in close contact with the inside wall of the cover shell 5. The chip unit 3 is inserted into the circular center through hole 21 within the upright contact flange 22, and then soldered to the flat, circular top projection 11 of the heat dissipation base 1. After installation of the chip unit 3, the resin 6 is molded on the chip unit 3 in the circular center through hole 21 within the upright contact flange 22 above the circular top projection 11 of the heat dissipation base 1. Because of the presence of the upright contact flange 22 around the circular center through hole 21, the molding of the resin 6 is easy. When covering the cover shell 5 on the hexagonal gasket 2, the upright contact flange 22 is press-fitted into the bottom open side of the cover shell 5, enabling the cover shell 5 to be soldered to the hexagonal gasket 2 positively in the accurate position. During spot soldering to solder the cover shell 5 to the hexagonal gasket 2, the upright contact flange 22 protects the chip unit 3 against radiation of fusion.

It is to be understood that the drawings are designed for purposes of illustration only, and are not intended for use as a definition of the limits and scope of the invention disclosed.

What the invention claimed is:

1. A power rectifier of the type comprising a heat dissipation base, said heat dissipation base comprising a flat, circular top projection disposed at a top side thereof and a screw rod disposed at a bottom side thereof and adapted for fastening to a heat sink, a hexagonal gasket soldered to the top side of said heat dissipation base around said flat, circular top projection, said hexagonal gasket having a circular center through hole, which receives the flat, circular top projection of said heat dissipation base, a chip unit soldered to said heat dissipation base, said chip unit comprising a bottom molybdenum pad soldered to the flat, circular top projection of said heat dissipation base and a top molybdenum pad, a resin molded on the top side of said heat dissipation base and said chip unit, a conducting rod member, said conducting rod member comprising a shank, a bottom soldering pad disposed at one end of said shank and soldered to the top molybdenum pad of said chip unit and a top contact tip disposed at an opposite end of said shank, and a cover shell soldered to said hexagonal gasket and covered over said chip unit and said conducting rod member, said cover shell comprising a center tube, which receives said shank of said conducting rod member, wherein: said hexagonal gasket comprises an upright contact flange disposed around said circular center through hole and press-fitted into a bottom open side of said cover shell to hold said resin and said chip unit in said resin.

* * * * *